(12) United States Patent
Han

(10) Patent No.: US 7,515,483 B2
(45) Date of Patent: Apr. 7, 2009

(54) PAGE BUFFER FLASH MEMORY DEVICE AND PROGRAMMING METHOD USING THE SAME

(75) Inventor: Jung Chul Han, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 160 days.

(21) Appl. No.: 11/480,330

(22) Filed: Jun. 30, 2006

(65) Prior Publication Data

US 2007/0064485 A1 Mar. 22, 2007

(30) Foreign Application Priority Data

Sep. 22, 2005 (KR) .................. 10-2005-0088097

(51) Int. Cl.
*G11C 7/10* (2006.01)
(52) U.S. Cl. .................. 365/189.05; 365/185.21; 365/185.22; 365/185.11; 365/230.08
(58) Field of Classification Search ............ 365/185.11, 365/185.22, 230.08, 189.05
See application file for complete search history.

(56) References Cited

U.S. PATENT DOCUMENTS

| 6,259,630 | B1 * | 7/2001 | Kawamura | 365/185.22 |
|---|---|---|---|---|
| 6,671,204 | B2 * | 12/2003 | Im | 365/185.12 |
| 6,717,857 | B2 * | 4/2004 | Byeon et al. | 365/185.21 |
| 6,738,288 | B2 * | 5/2004 | Kawamura et al. | 365/185.11 |
| 2003/0076719 | A1 * | 4/2003 | Byeon et al. | 365/200 |
| 2004/0174727 | A1 * | 9/2004 | Park | 365/100 |
| 2005/0018488 | A1 * | 1/2005 | Kim et al. | 365/185.28 |
| 2005/0152188 | A1 * | 7/2005 | Ju | 365/185.22 |
| 2007/0002615 | A1 * | 1/2007 | Lee et al. | 365/185.03 |
| 2007/0002621 | A1 * | 1/2007 | Park | 365/185.11 |
| 2007/0002624 | A1 * | 1/2007 | Ju | 365/185.12 |
| 2007/0195635 | A1 * | 8/2007 | Chen et al. | 365/230.08 |

FOREIGN PATENT DOCUMENTS

| JP | 08-031186 A | 2/1996 |
|---|---|---|
| KR | 2003-0011234 A | 2/2003 |
| KR | 10-2003-0051043 A | 6/2003 |
| KR | 10-2006-0031989 A | 4/2006 |
| KR | 10-2006-0070947 A | 6/2006 |

* cited by examiner

*Primary Examiner*—Hoai V Ho
*Assistant Examiner*—Jay Radke
(74) *Attorney, Agent, or Firm*—Townsend and Townsend and Crew LLP

(57) ABSTRACT

A page buffer of a flash memory device is configured to program two pages in a single programming operation. The page buffer of the flash memory device includes a first bit line selection unit, a second bit line selection unit, a separation unit, a precharge unit, a first register, and a second register.

20 Claims, 6 Drawing Sheets

PAGE BUFFER FLASH MEMORY DEVICE AND PROGRAMMING METHOD USING THE SAME

BACKGROUND OF THE INVENTION

The present invention relates to a page buffer of a flash memory device and a programming method using the same, in which two pages can be programmed through one programming operation.

A flash memory is a kind of a non-volatile memory in which data can be stored even when the power is turned off. The flash memory can be electrically programmed and erased and does not need a refresh function of rewriting data at regular intervals. The term "program" refers to the operation of programming data into the memory cells and the term "erase" refers to the operation of erasing data from the memory cells.

The flash memory device can be mainly classified into a NOR flash memory device and a NAND flash memory device depending on the structure of the cell and operation conditions. In a NOR flash memory device, the source of each memory cell transistor is connected to the ground terminal (VSS) and programmed and erased for possible predetermined addresses. Accordingly, the NOR flash memory has been mainly used for application fields requiring the high-speed operation.

On the other hand, in a NAND flash memory device, a plurality of memory cells are connected in series to form one string. One string is connected to the source and drain. The NAND flash memory has been mainly used for high integration data retention related fields.

The NAND flash memory device employs a page buffer in order to store a large capacity of information or read stored information within a short period of time. The page buffer supplies a large capacity of data, which are received from an input/output pad, to memory cells, or stores data of memory cells and outputs the stored data.

The page buffer generally includes a single register in order to temporarily store data. Recently, a dual register has been used in the NAND flash memory device in order to improve the program speed when programming a large capacity of data.

FIG. 1 is a block diagram illustrating the stack structure of page buffers of a conventional NAND flash memory device.

Referring to FIG. 1, a pair of bit lines (i.e., two bit lines) are commonly connected to one page buffer. Accordingly, one page is programmed through one programming operation.

FIG. 2A illustrates a program time consumed during a normal programming operation.

In FIG. 2A, 100 μs denotes a time taken to input data to the page buffer. 300 μs denotes a time taken to program the data input to the page buffer into a corresponding memory cell. The page buffer includes one latch circuit. Accordingly, a total of 1600 μs program time is taken to program four pages through the normal programming operation.

In the normal programming method, both the data input time and the data program time are taken to program one page. Accordingly, a great amount of program time is taken compared with the cache program.

FIG. 2B illustrates a program time taken during the existing cache programming operation. In FIG. 2B, the page buffer includes two latch circuits (i.e., a main latch circuit and a cache latch circuit).

In FIG. 2B, 100 μs that is shown in FIG. 2B denotes a time which is taken from when data are input to the cache latch of the page buffer to when the data input to the cache latch are transferred to the main latch; 300 μs denotes a time which is taken to program the data input to the main latch of the page buffer into a corresponding memory cell. At this time, an operation is performed for inputting data to the cache latch of the page buffer, and then for transferring the data, which have been input to the cache latch, to the main latch.

Therefore, only an operating time taken to input data is required. Thereafter, in the case where four pages are programmed using the cache program method with the data input time being buried in the program time, a total of 1300 μs program time is consumed.

As described above, the cache programming method is disadvantageous in that an additional cache latch is required and the number of cells that can be programmed once does not exceed one page.

BRIEF SUMMARY OF THE INVENTION

An embodiment of the present invention provides a page buffer of a NAND flash memory device, in which it can program two pages through one programming operation.

Another embodiment of the present invention provides a programming method, wherein two pages can be programmed when one programming operation is performed using a page buffer connected to two or more pairs of bit lines.

According to one embodiment of the present invention, there is provided a page buffer of a flash memory device including a memory cell array, the page buffer including a first bit line selection unit that selects one of at least one pair of first bit lines connected to a memory cell array and connects the selected bit line to a first sensing line, a second bit line selection unit that selects one of at least one pair of second bit lines connected to the memory cell array and connects the selected bit line to a second sensing line, a separation unit that separates or connects the first sensing line and the second sensing line, a precharge unit that precharges the first and second sensing lines, a first register connected to the first bit line selection unit through the first sensing line, for latching input data, and a second register connected to the second bit line selection unit through the second sensing line, for latching input data.

According to another embodiment of the present invention, there is provided a page buffer of a flash memory device including a memory cell array, the page buffer including a first bit line selection unit that selects one of at least one pair of first bit lines connected to the memory cell array and connects the selected bit line to a first sensing line, a second bit line selection unit that selects one of at least one pair of second bit lines connected to the memory cell array and connects the selected bit line to a second sensing line, a separation unit that separates or connects the first sensing line and the second sensing line, a precharge unit that precharges the first and second sensing lines, a first register connected to the first bit line selection unit through the first sensing line, for latching input data, a second register connected to the second bit line selection unit through the second sensing line, for latching input data, and a third register connected to the second bit line selection unit through the second sensing line, for latching input data.

According to one embodiment of the present invention, there is provided a programming method employing a page buffer of a flash memory device including a memory cell array, the programming method including: latching input data in a first register connected to at least one pair of first bit lines, which are connected to the memory cell array, through a first sensing line; latching input data in a second register connected to at least one pair of second bit lines, which are connected to the memory cell array, through a second sensing line; and loading the input data latched in the first register onto one of the first bit lines through the first sensing line and programming the loaded data into a corresponding memory cell within the memory cell array, and at the same time, loading the input data latched in the second register onto one of the second bit lines through the second sensing line and programming the loaded data into a corresponding memory cell within the memory cell array.

According to another embodiment of the present invention, there is provided a programming method employing a page buffer of a flash memory device including a memory cell array, the programming method including: (a) latching input data in a first register connected to at least one pair of first bit lines, which are connected to the memory cell array, through a first sensing line, (b) latching input data in a second register connected to at least one pair of second bit lines, which are connected to the memory cell array, through a second sensing line, (c) loading the input data latched in the first register onto one of the first bit lines through the first sensing line and programming the loaded data into a corresponding memory cell within the memory cell array, and at the same time, loading the input data latched in the second register onto one of the second bit lines through the second sensing line and programming the loaded data into a corresponding memory cell within the memory cell array, while latching the input data in a third register, and (d) transferring the input data latched in the third register to the first register through the first and second sensing lines and latching the transferred data, and at the same time, latching the input data in the second register again.

BRIEF DESCRIPTION OF THE DRAWINGS

A more complete appreciation of the invention, and many of the advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described in detail in connection with certain exemplary embodiments with reference to the accompanying drawings.

Figure 1:
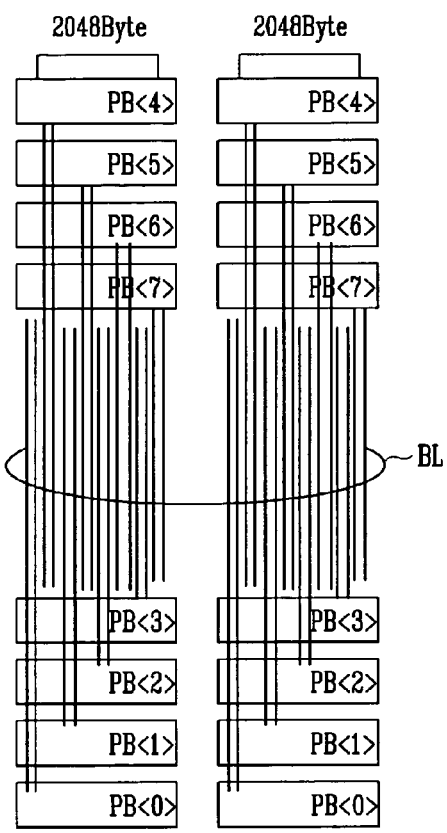
FIG. 1 is a block diagram illustrating the stack structure of page buffers of a conventional NAND flash memory device.
Figure 2A:
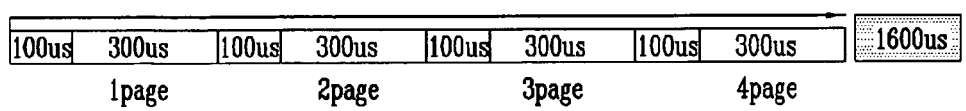
FIGS. 2A and 2B are timing diagrams illustrating program times of the conventional NAND flash memory device.
Figure 2B:
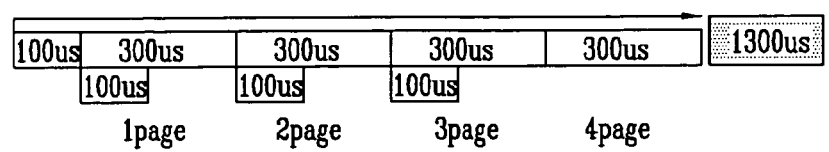
Figure 3:
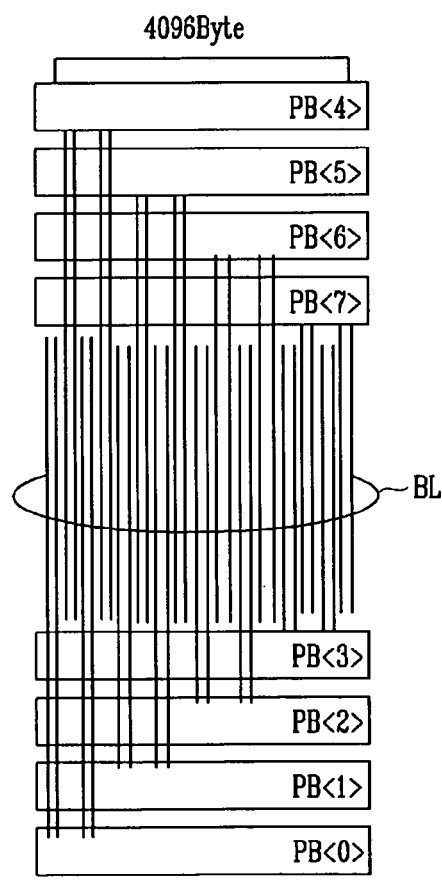
FIG. 3 is a block diagram illustrating the stack structure of page buffers of a NAND flash memory device according to an embodiment of the present invention.

FIG. 3 is a block diagram illustrating the stack structure of page buffers of a NAND flash memory device according to an embodiment of the present invention.

Referring to FIG. 3, two pairs of bit lines (i.e., four bit lines BL) are commonly connected to one page buffer PB. Accordingly, the number of page buffers can be reduced by half in comparison with the conventional art. Furthermore, in such a connection structure, two pages can be programmed through one programming operation.

Figure 4A:
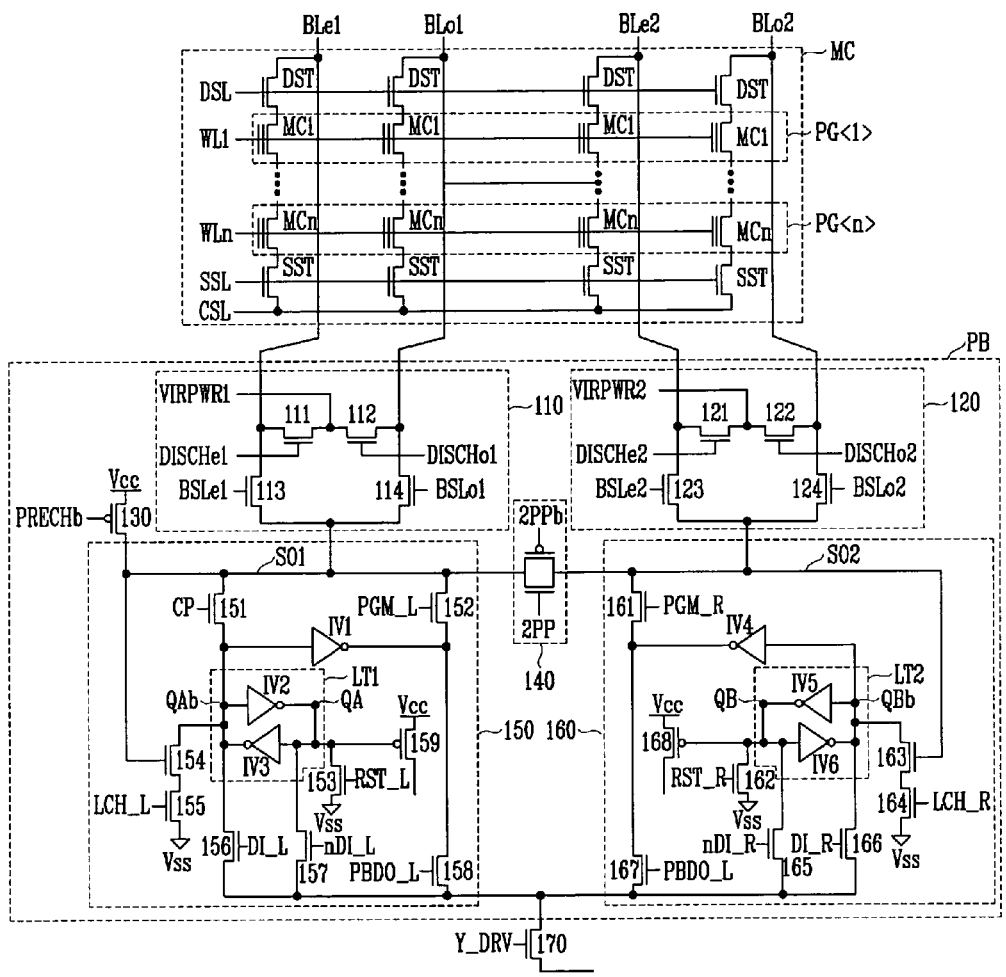
FIGS. 4A and 4B are detailed circuit diagrams of the page buffers according to an embodiment of the present invention.
Figure 4B:
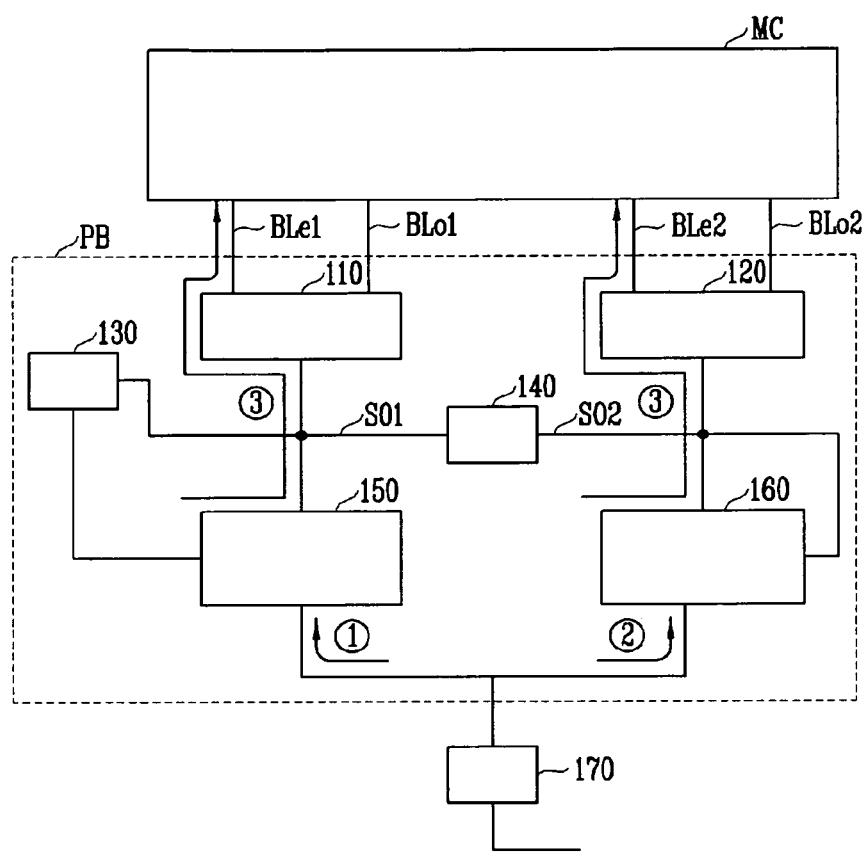

FIGS. 4A and 4B are views illustrating the page buffer of the NAND flash memory device and a two-page programming method using the same according to one embodiment of the present invention. FIG. 4A is a detailed circuit diagram of each page buffer shown in FIG. 3. FIG. 4B is a block diagram illustrating a method of performing the two-page programming operation using the page buffer shown in FIG. 4A.

Referring to FIG. 4A, the NAND flash memory device includes a memory cell array MC, a page buffer PB, and a column selection unit 170. The page buffer PB is connected between the memory cell array MC, and the column selection unit 170.

In FIG. 4B, BLe denotes even-numbered bit lines and BLo denotes odd-numbered bit lines. Memory cells MC1 to MCn and source and drain select transistors SST, DST, which are connected to one bit line (for example, BLe 1), form one string. Memory cells controlled by one word line (for example, WL1) form one page.

The page buffer PB includes first and second bit line selection units 110, 120, a precharge unit 130, a separation unit 140, a first register 150, and a second register 160.

The first bit line selection unit 110 includes NMOS transistors 111 to 114. The NMOS transistor 111 has one end connected to the bit line BLe 1 and the other end connected to a line for providing a voltage supply signal VIRPWR1. A gate of the NMOS transistor 111 is supplied with a gate control signal DISCHe. The NMOS transistor 111 is turned on in response to the gate control signal DISCHe1 and supplies a power supply voltage Vcc to the bit line BLe 1 as the voltage supply signal VIRPWR1 if data are to be programmed into the bit line BLo1.

The NMOS transistor 112 has one end connected to a bit line BLo 1 and the other end connected to the line for providing a voltage supply signal VIRPWR1. A gate of the NMOS transistor 112 is applied with a gate control signal DISCHo1. The NMOS transistor 112 is turned on in response to the gate control signal DISCHo1 and applies the power supply voltage Vcc to the bit line BLo1 as the voltage supply signal VIRPWR1 if data are to be programmed into the bit line BLe1. The voltage supply signal VIRPWR1 has the power supply voltage Vcc during the programming operation.

The NMOS transistor 113 connects the bit line BLe1 to a sensing line SO1 in response to a bit line selection signal BSLe1. The NMOS transistor 114 connects a bit line BLo1 to the sensing line SO1 in response to a bit line selection signal BSLo1.

The second bit line selection unit 120 has the same construction as that of the first bit line selection unit 110. Description of the second bit line selection unit 120 will be omitted for simplicity.

The precharge unit 130 is connected between the power supply voltage Vcc and the sensing line SO1 and includes a PMOS transistor having a gate to which a precharge signal PRECHb is applied. The PMOS transistor 130 precharges the sensing line SO1 to the power supply voltage Vcc during the read operation and supplies current to a bit line BLe1 or BLo1 through the sensing line SO1.

The separation unit 140 serves to separate the sensing line SO1 and a sensing line SO2 in response to two-page program signals 2PP, 2PPb when programming data into a memory cell MC1 connected to selected bit lines (for example, BLe1, BLe2) and one word line (for example, WL1). The separation unit 140 includes a transfer gate, but may include a NMOS transistor or a PMOS transistor.

The first register 150 includes NMOS transistors 151 to 158, a latch circuit LT1, a PMOS transistor 159, and an inverter IV1.

The NMOS transistor 151 is connected between the sensing line SO1 and the latch circuit LT1 and has a gate to which a copyback signal CP is applied during the copyback programming operation. The NMOS transistor 151 serves to connect the latch circuit LT1 and the sensing line SO1 in order to re-program data of a fail cell, which are latched in the latch circuit LT1, into a normal cell during the copyback programming operation.

The latch circuit LT1 includes inverters IV2, IV3. The latch circuit LT1 latches data read from a memory cell or latches externally input data to be programmed.

An inverter IV1 inverts a signal of a node QAb of the latch circuit LT1 and outputs an inverted signal.

The NMOS transistor 152 is turned on in response to a program signal PGM_L during the programming operation. The NMOS transistor 152 receives a signal of input data latched in the latch circuit LT1 (i.e., the node QAb) through the inverter IV1 and transmits the signal to a selected bit line (for example, BLe1) through the sensing line SO1.

The NMOS transistor 153 is connected between a node QA of the latch circuit LT1 and a ground VSS and has a gate to which a reset signal RST_L is applied. The NMOS transistor 153 initializes the node QA of the latch circuit LT1 to "0" and the node QAb to "1".

The NMOS transistors 154, 155 are connected in series between the node QAb and the ground VSS. The NMOS transistor 154 is turned on or off in response to a signal of the sensing line SO1. The NMOS transistor 155 is turned on or off in response to a latch signal LCH_L. The NMOS transistors 154, 155 sense a signal of the sensing line SO1, and converts the node QAb of the latch circuit LT1 into "0" and the node QA into "1" or maintain an initial value.

The NMOS transistors 156, 157 are turned on in response to data input signals DI_L and nDI_L, respectively, during the programming operation and latch data, which are externally received through a data I/O line (not shown) and will be programmed, to the latch circuit LT1.

The NMOS transistor 158 is turned on in response to a read signal PBDO_L during the read operation. The NMOS transistor 158 receives a signal of the node QAb, which has been read by the latch circuit LT1 and then latched therein, through the inverter IV1, and transmits the signal to the data I/O line through the column selection unit 170.

The PMOS transistor 159 serves to verify a program and verifies pass or fail of a program by reading a signal of the node QA of the latch circuit LT1.

The second register 160 includes NMOS transistors 161 to 167, a latch circuit LT2, a PMOS transistor 168, and an inverter IV4. These constituent elements are the same as those of the first register 150 except that the NMOS transistor used during the copyback programming operation is omitted. Therefore, description of the constituent elements and operation thereof will be omitted for simplicity.

The column selection unit 170 includes a NMOS transistor that is controlled in response to a column selection signal Y_DRV. The NMOS transistor 170 functions to connect the page buffer PB and the data I/O line during the read and programming operation.

As described above, page buffer PB is connected to two pairs of bit lines (i.e., four bit lines BLe1, BLo1, BLe2, and BLo2). The first and second bit line selection units 110, 120 and the first and second registers 150, 160 operate at the same time during the programming operation, and program data into the memory cells MC1 connected to two selected bit lines (for example, BLe1, BLe2) and one word line (for example, WL1) at the same time. In other words, according to the present invention, two pages are programmed through one programming operation unlike the conventional art.

A programming operation of the NAND flash memory device according to one embodiment of the present invention will be described below in detail with reference to FIG. 4B.

The separation unit 140 is first turned off so that the sensing line SO1 and the sensing line SO2 are separated from each other. Data to be programmed, which are input through the column selection unit 170, are latched in the latch circuit of the first register 150 (path 1). For example, data "0" may be latched in the node QA of the latch circuit LT1 shown in FIG. 4A and data "1" may be latched in the node QAb of the latch circuit LT1 shown in FIG. 4A.

The data to be programmed, which are input through the column selection unit 170, are then latched in the latch circuit of the second register 160 (path 2). For example, data "0" may be latched in the node QB of the latch circuit LT2 shown in FIG. 4A and data "1" may be latched in the node QBb of the latch circuit LT2 shown in FIG. 4A.

In one embodiment of the present invention, the NMOS transistors 152, 161 shown in FIG. 4A are simultaneously turned on. Accordingly, data "0" in which the data "1" of the node QAb are inverted through the inverter IV1 are applied to a selected bit line (for example, BLe1) through the sensing line SO1, thereby programming the data into a corresponding memory cell. At the same time, data "0" in which the data "1" of the node QBb are inverted through the inverter IV4 are applied to a selected bit line (for example, BLe2) through the sensing line SO2, thereby programming the data into a corresponding memory cell (path 3).

As described above, according to an embodiment of the present invention, input data to be programmed are first latched in the first register 150 (path 1). The input data are then latched in the second register 160 (path 2). The input data latched in the first and second registers 150, 160 are programmed into two memory cells through two selected bit lines (for example, BLe1, BLe2) at the same time (path 3).

In the conventional art, input data are programmed into only one memory cell through one selected bit line (for example, BLe1) using one page buffer on a page basis. In an embodiment of the present invention, however, input data to be programmed can be programmed into two memory cells through two selected bit lines (for example, BLe1, BLe2) on a two-page basis.

It has been described that two pages are programmed through one programming operation using the page buffer shown in FIG. 4A. It is, however, to be understood that the separation unit 140 may be turned off in order to perform the cache programming operation. At this time, the first register 150 may serve as a main latch and the second register 160 may serve as a cache latch. Furthermore, one bit line can be selected using the first bit line selection unit 110 or the second bit line selection unit 120.

Figure 5A:
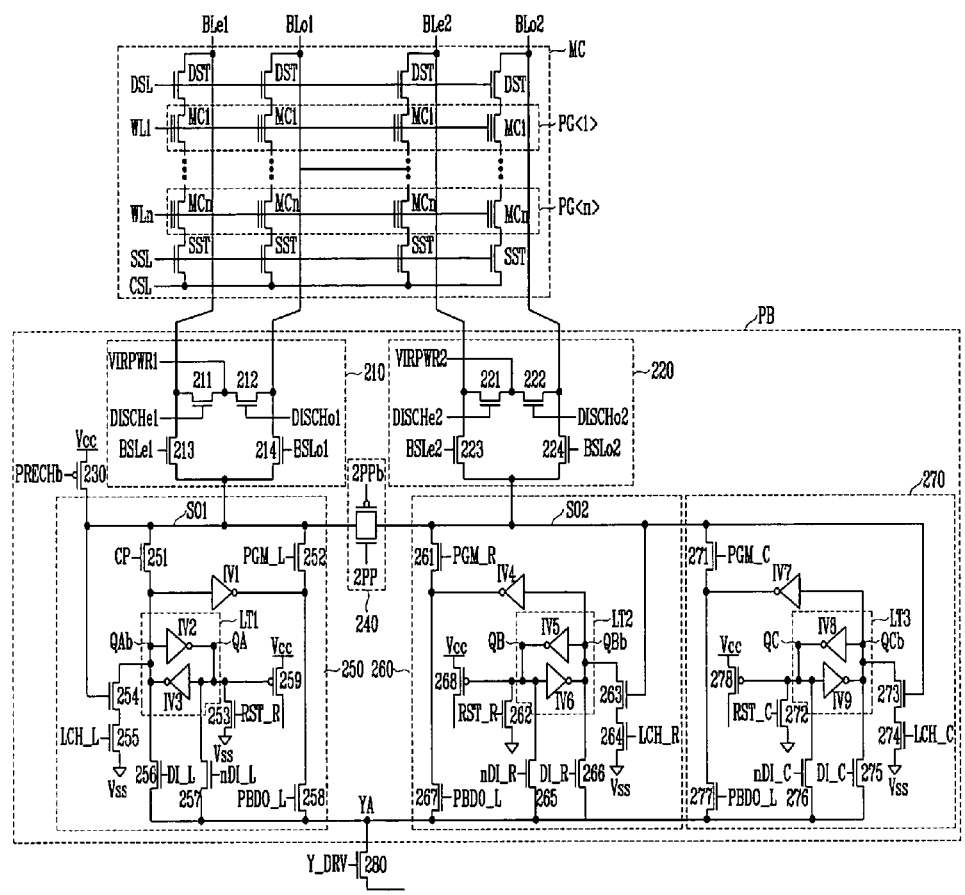
FIGS. 5A and B are detailed circuit diagrams of the page buffers according to another embodiment of the present invention.
Figure 5B:
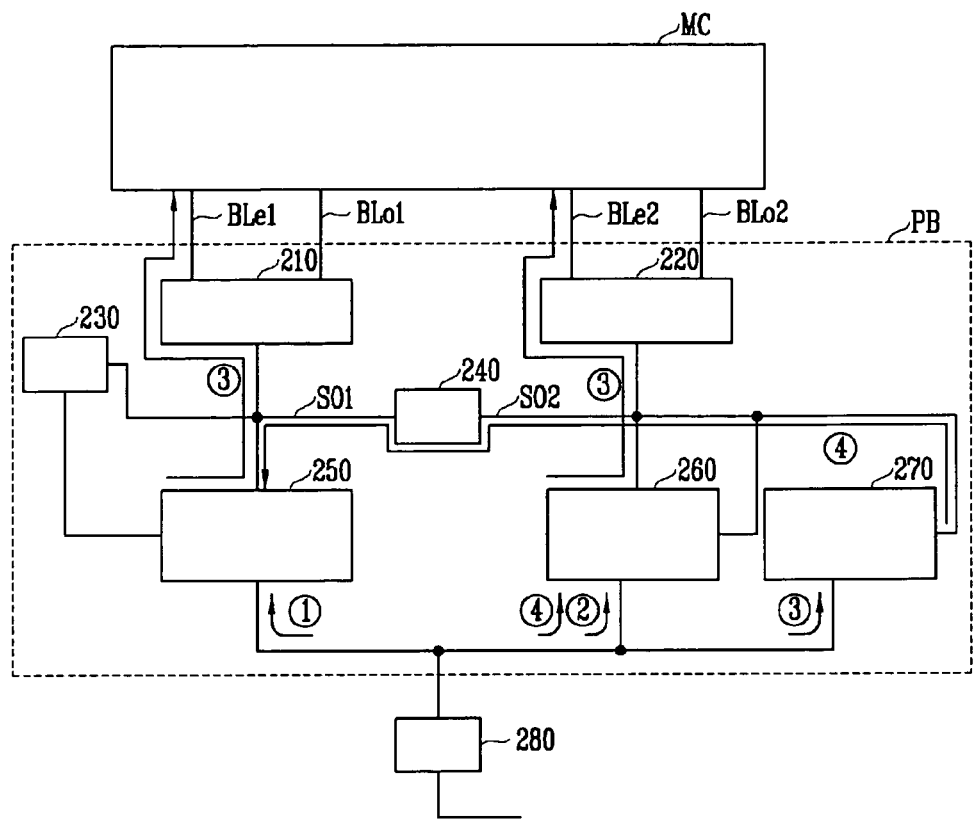

FIGS. 5A and 5B illustrate a page buffer of a NAND flash memory device and a programming method using the same according to an embodiment of the present invention. FIG.

5A is a circuit diagram of each page buffer shown in FIG. 3. FIG. 5B is a block diagram illustrating a method of performing the two-page programming operation using the page buffer shown in FIG. 5A.

The page buffer shown in FIG. 5A is similar to that shown in FIG. 4A. The page buffer shown in FIG. 4A includes two latch units, whereas the page buffer shown in FIG. 5A includes three latch units.

Referring to FIG. 5B, a transfer gate 240 is first turned off so that the sensing line SO1 and the sensing line SO2 are separated from each other. Data to be programmed, which are input through the column selection unit 280, are latched in the latch circuit of the first register 250 (path 1). For example, data "0" may be latched in the node QA of the latch circuit LT1 shown in FIG. 5A and data "1" may be latched in the node QAb of the latch circuit LT1 shown in FIG. 5A.

The data to be programmed, which are input through the column selection unit 280, are then latched in the latch circuit of the second register 260 (path 2). For example, data "0" may be latched in the node QB of the latch circuit LT2 shown in FIG. 5A and data "1" may be latched in the node QBb of the latch circuit LT2 shown in FIG. 5A.

The NMOS transistors 252, 261 shown in FIG. 5A are turned on together. Accordingly, data "0" in which the data "1" of the node QAb are inverted through the inverter IV1 are applied to a selected bit line (for example, BLe1) through the sensing line SO1, thereby programming the data into a corresponding memory cell. At the same time, data "0" in which the data "1" of the node QBb are inverted through the inverter IV4 are applied to a selected bit line (for example, BLe2) through the sensing line SO2, thereby programming the data into a corresponding memory cell (path 3).

The data input through the column selection unit 280 are latched in the latch circuit of the cache latch unit 270 together with the programming operation. For example, data "0" may be latched in the node QB of the latch circuit LT2 shown in FIG. 5A and data "1" may be latched in the node QBb of the latch circuit LT2 shown in FIG. 5A.

Thereafter, the separation unit 240 is turned on to connect the sensing line SO1 and the sensing line SO2. The NMOS transistor 271 is then turned on to transfer data "0" in which the data "1" of the node QCb, which have been latched in the latch circuit LT3 shown in FIG. 5A, are inverted from the sensing line SO2 to the sensing line SO1. The NMOS transistor 251 is then turned on to latch the data "1", which have been loaded on the sensing lines SO1, SO2, in the latch circuit LT1 of the first register 250 (path 3). The data input through the column selection unit 280 are latched in the latch circuit LT2 of the second register 260 simultaneously with the operation (path 4). Thereafter, the method may be repeatedly performed to program the desired pages.

It has been described above that two pages are programmed through one programming operation using the page buffer shown in FIG. 5A. It is, however, to be understood that the separation unit 240 may be turned off in order to perform the cache programming operation. At this time, the first register 250 may serve as a main latch, the second register 260 may serve as a cache latch, and the third register 270 may serve as a cache latch. Furthermore, one bit line can be selected using the first bit line selection unit 210 or the second bit line selection unit 220.

Figure 6A:
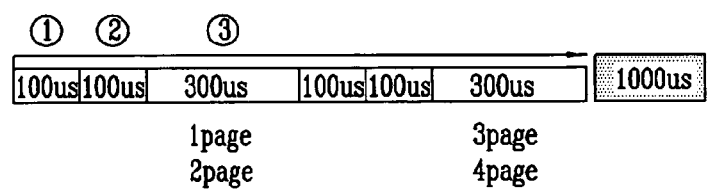
FIG. 6A is a timing diagram illustrating a program time when the page buffers shown in FIGS. 4A and 4B are used; and when the page buffers shown in FIGS. 5A and 5B are used.

FIG. 6A illustrates a program time consumed when four pages are programmed using the programming method shown in FIG. 4B. Reference numerals 1 to 3 shown in FIG. 6A correspond to 1 to 3 shown in FIG. 4B.

Referring to FIGS. 4B and 6A, if a time at which input data to be programmed are input to the first register 150 is 100 µs (numeral 1), a time at which program data are input to the second register 160 is 100 µs (numeral 2), and a time at which the input data latched in the first and second registers 150, 160, respectively, are programmed into corresponding memory cells is 300 µs (numeral 3), a four-page program time is 1000 µs in total. In this case, since two pages can be programmed through one programming operation, a program time of 600 µs can be shortened in comparison with the conventional art normal programming operation.

Figure 6B:
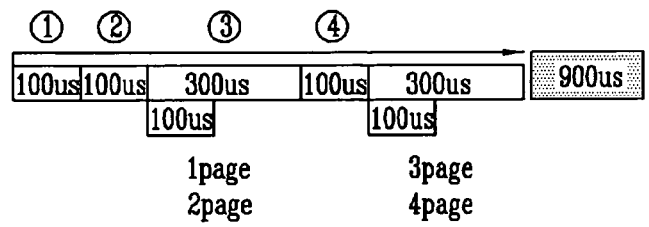
FIG. 6B illustrates a program time consumed when four pages are programmed using the cache programming method shown in FIG. 5B.

FIG. 6B illustrates a program time consumed when four pages are programmed using the cache programming method shown in FIG. 5B. Reference numerals 1 to 4 shown in FIG. 6B correspond to 1 to 4 shown in FIG. 5B.

Referring to FIGS. 5B and 6B, if a time at which input data to be programmed are input to the first register 250 is 100 µs (numeral 1), a time at which the input data are input to the second register 260 is 100 µs (numeral 2), a time at which the input data latched in the first and second registers 250, 260, respectively, are programmed into corresponding memory cells is 300 µs (numeral 3), and a time at which input data stored in the third register 270 are transferred to the first register 250 is 100 µs (numeral 4), a four-page program time is 900 µs in total. In this case, since two pages can be programmed through one programming operation, a program time of 300 µs can be shortened in comparison with the conventional art cache programming operation.

As described above, in the conventional art, input data to be programmed are programmed into only one memory cell through one selected bit line using one page buffer. In other words, only one page is programmed through one programming operation. In the present invention, however, input data to be programmed can be programmed into two memory cells through two selected bit lines using one page buffer. In other words, two pages can be programmed through one programming operation.

In accordance with the present invention, since four bit lines are connected to one page buffer, two pages can be programmed through one programming operation. Accordingly, the present invention is advantageous in that it can significantly enhance the program speed when programming multiple pages.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A page buffer of a flash memory device including a memory cell array, the page buffer comprising:

a first bit line selection unit configured to select one of at least one pair of first bit lines coupled to the memory cell array and to connect the selected bit line to a first sensing line;

a second bit line selection unit configured to select one of at least one pair of second bit lines coupled to the memory cell array and to connect the selected bit line to a second sensing line;

a separation unit configured to disconnect the first sensing line and the second sensing line during a programming operation such that memory cells of the memory cell array corresponding to the selected first bit line and the selected second bit line are simultaneously programmed, the separation unit further configured to connect the first sensing line and the second sensing line during a cache program operation;

a precharge unit configured to precharge the first and second sensing lines;

a first register coupled to the first bit line selection unit through the first sensing line, the first register configured to latch a first input data; and a second register coupled to the second bit line selection unit through the second sensing line, the second register configured to latch a second input data, wherein the first input data and the second input data are simultaneously programmed in the memory cells corresponding to the selected first bit line and the selected second bit line, respectively, such that the first input data and the second input data are programmed in the corresponding memory cells on a two-page basis.

2. The page buffer as claimed in claim 1, wherein during the programming operation, the first and second registers load latched input data onto one of the first bit lines and one of the second bit lines, respectively, at the same time.

3. A page buffer of a flash memory device including a memory cell array, the page buffer comprising:

a first bit line selection unit configured to select one of at least one pair of first bit lines coupled to the memory cell array and to connect the selected bit line to a first sensing line;

a second bit line selection unit configured to select one of at least one pair of second bit lines coupled to the memory cell array and to connect the selected bit line to a second sensing line;

a separation unit configured to disconnect the first sensing line and the second sensing line during a programming operation such that memory cells of the memory cell array corresponding to the selected first bit line and the selected second bit line are simultaneously programmed, and further configured to connect the first sensing line and the second sensing line during a cache program operation;

a precharge unit configured to precharge the first and second sensing lines;

a first register coupled to the first bit line selection unit through the first sensing line, the first register configured to latch a first input data;

a second register coupled to the second bit line selection unit through the second sensing line, the second register configured to latch a second input data; and a third register coupled to the second bit line selection unit through the second sensing line, the third register configured to latch a third input data, wherein the first input data and the second input data are simultaneously programmed on memory cells corresponding to the selected first bit line and the selected second bit line, respectively, during the of latching the third input data on the third register such that the first input data and the second input data are programmed in the corresponding memory cells on a two-page basis.

4. The page buffer as claimed in claim 3, wherein during the programming operation, the first and second registers load the latched first and second input data onto one of the first bit lines and one of the second bit lines, respectively, at the same time, and program the latched first and second input data into the corresponding memory cells of the memory cell array, and at the same time, the third register receives and latches the third input data.

5. The page buffer as claimed in claim 4, wherein in the event that the separation unit connects the first and second sensing lines after the two-page programming operation, the third register transmits the latched third input data to the first register through the first and second sensing lines and at the same time, the second register receives the second input data again and latches the received second input data.

6. The page buffer as claimed in claim 1, wherein the first and second bit line selection units select one of the first bit lines and one of the second bit lines, respectively, during the programming operation.

7. The page buffer as claimed in claim 1, wherein during the programming operation, the first register loads the latched first input data onto one of the first and second bit lines, and programs the loaded first input data into a corresponding memory cell of the memory cell array in a one-page-program manner.

8. The page buffer as claimed in claim 1, wherein the separation unit connects the first and second sensing lines when the precharge unit charges the first and second sensing lines, and separates the first and second sensing lines after the precharge operation.

9. The page buffer as claimed in claim 1, wherein the separation unit comprises a transfer gate.

10. The page buffer as claimed in claim 1, wherein the separation unit comprises a MOS transistor.

11. The page buffer as claimed in claim 1, wherein each of the first and second registers comprises:

a sensing unit configured to sense a voltage of the first or second sensing line in response to a latch signal and to generate sensing data according to the sensing result;

a latch circuit configured to latch the sensing data or the input data;

a program unit configured to output the input data latched in the latch circuit to either the first or second bit line coupled to the first or second sensing line in response to a program signal;

a read unit configured to output the sensing data latched in the latch circuit to a data I/O line in response to a read signal;

a verification unit configured to output a verifying result in response to the sensing data of the latch circuit; and a data input unit configured to transfer the input data, which are received through the data I/O line, to the latch circuit in response to input signals.

12. The page buffer as claimed in claim 11, wherein the first register further comprises:

a copyback program unit which is coupled between the first or second sensing line and the latch circuit and is driven during a copyback programming operation; and a reset unit configured to initialize the latch circuit in response to a reset signal.

13. The page buffer as claimed in claim 11, wherein the second register further comprises a reset unit that initializes the latch circuit in response to a reset signal.

14. The page buffer as claimed in claim 3, wherein the third register has the same construction as that of the second register.

15. A programming method employing a page buffer of a flash memory device including a memory cell array, the programming method comprising:

connecting one of at least one pair of first bit lines coupled to the memory cell array to a first sensing line;

connecting one of at least one pair of second bit lines coupled to the memory cell array to connect a second sensing line;

disconnecting the first sensing line and the second sensing line during a programming operation such that memory cells of the memory cell array corresponding to the selected first bit line and the selected second bit line are simultaneously programmed;

connecting the first sensing line and the second sensing line during a cache program operation;

latching first input data in a first register coupled to the at least one pair of the first bit lines through the first sensing line;

latching second input data in a second register coupled to the at least one pair of second bit lines through the second sensing line; and loading the first input data latched in the first register onto one of the first bit lines through the first sensing line and programming the loaded first input data into a corresponding memory cell within the memory cell array, and at the same time, loading the second input data latched in the second register onto one of the second bit lines through the second sensing line and programming the loaded second input data into a corresponding memory cell within the memory cell array, such that the first input data and the second input data are programmed in the corresponding memory cells on a two-page basis.

16. The programming method as claimed in claim 15, further comprising:

at the same time as disconnecting the first sensing line and the second sensing line, connecting one of the second bit lines to the second sensing line.

17. A programming method employing a page buffer of a flash memory device including a memory cell array, the programming method comprising:

(a) connecting one of at least one pair of first bit lines coupled to the memory cell array to a first sensing line;

(b) connecting one of at least one pair of second bit lines coupled to the memory cell array to connect a second sensing line;

(c) disconnecting the first sensing line and the second sensing line during a programming operation such that memory cells of the memory cell array corresponding to the selected first bit line and the selected second bit line are simultaneously programmed;

(d) connecting the first sensing line and the second sensing line during a cache program operation;

(e) latching first input data in a first register coupled to the at least one pair of the first bit lines through the first sensing line;

(f) latching second input data in a second register coupled to the at least one pair of the second bit lines through the second sensing line;

(g) loading the first input data latched in the first register onto one of the first bit lines through the first sensing line and programming the loaded first input data into a corresponding memory cell within the memory cell array, and at the same time, loading the second input data latched in the second register onto one of the second bit lines through the second sensing line and programming the loaded second input data into a corresponding memory cell within the memory cell array, while latching third input data in a third register, such that the first input data and the second input data are programmed in the corresponding memory cells on a two-page basis; and (h) transferring the third input data latched in the third register to the first register through the first and second sensing lines and latching the transferred third input data, and at the same time, latching the second input data in the second register again.

18. The programming method as claimed in claim 17, wherein after the step (h), the steps (g) and (h) are repeatedly performed to program a predetermined number of pages.

19. The programming method as claimed in claim 17, further comprising connecting the first sensing line and the second sensing line before transferring the third input data latched in the third register to the first register through the first and second sensing lines.

20. The programming method as claimed in claim 17, wherein steps (a) and (b) are performed simultaneously.

* * * * *